United States Patent [19]
Fukuda et al.

[11] Patent Number: 5,489,901
[45] Date of Patent: Feb. 6, 1996

[54] DATA INPUT/OUTPUT CIRCUIT FOR A DIGITAL SIGNAL PROCESSING SYSTEM

[75] Inventors: Mituyoshi Fukuda, Ohizumi; Masahisa Shimizu, Hirakata; Hideki Ohashi, Kyoto; Masaki Kawaguchi, Hirakata, all of Japan

[73] Assignee: Sanyo Electric Co., Ltd., Osaka, Japan

[21] Appl. No.: 21,832

[22] Filed: Feb. 24, 1993

Related U.S. Application Data

[63] Continuation of Ser. No. 713,043, Jun. 7, 1991, abandoned, which is a continuation of Ser. No. 243,082, Sep. 9, 1988, abandoned.

[30] Foreign Application Priority Data

Sep. 16, 1987 [JP] Japan ................... 62-231576

[51] Int. Cl.$^6$ .................................... H03M 7/00
[52] U.S. Cl. .................... 341/78; 341/50; 377/70; 377/64
[58] Field of Search ...................... 341/100, 101, 341/50, 78; 377/70, 64

[56] References Cited

U.S. PATENT DOCUMENTS

| | | | |
|---|---|---|---|
| 3,432,243 | 11/1970 | Nordquist | 364/900 |
| 3,742,466 | 6/1973 | Hamm et al. | 365/73 |
| 3,967,101 | 6/1976 | Fett | 235/152 |
| 3,971,920 | 7/1976 | Johnson | 377/67 |
| 4,079,372 | 3/1978 | Koenig | 341/100 |
| 4,429,300 | 1/1984 | Yamasawa et al. | 341/100 |
| 4,504,925 | 3/1985 | Gilhouson | 364/900 |
| 4,563,752 | 1/1986 | Pelgrom et al. | 364/900 |
| 4,594,685 | 6/1986 | Owens | 364/900 |
| 4,620,180 | 10/1986 | Carlton | 341/100 |

*Primary Examiner*—Kevin A. Kriess
*Attorney, Agent, or Firm*—Leo Stanger

[57] ABSTRACT

A data input/output circuit includes a 32-bit reversible shift register (1) which includes four 8-bit reversible shift registers (2–5). Input gate circuits (6, 7) selectively apply data being inputted in a bit-serial fashion from an external to the 8-bit reversible shift registers (3, 4), and output gate circuits (8–12) selectively output data being stored in arbitrary stages of the 32-bit reversible shift register (1) in a bit-serial fashion. Input latches (13–15) and output latches (16–18) each of which is an 8-bit latch are connected to the respective 8-bit reversible shift registers (2–4) and a data bus (19). The input latches (13–15) hold the data being stored in the 8-bit reversible shift registers (2–4) and send the same onto the data bus (19) in a bit-parallel fashion, and the output latches (16–18) hold the data being sent from the data bus (19) and preset the same into the 8-bit reversible shift registers (2–4) in a bit-parallel fashion.

10 Claims, 2 Drawing Sheets

→ DIRECTION OF DATA TRANSFER

DATA INPUT/OUTPUT CIRCUIT FOR A DIGITAL SIGNAL PROCESSING SYSTEM

This is a continuation of application Ser. No. 713,043 filed Jun. 7, 1991, which in turn is a continuation of application Ser. No. 243,082 filed Sep. 9, 1988, both now abandoned.

BACKGROUND OF THE INVENTION

1. Field of the Invention

The present invention relates to a data input/output circuit which is used for transferring data to or from device or circuit being connected to an external, and more specifically, relates to a data input/output circuit capable of being applied to the devices or circuits in which data formats are different from each other.

2. Description of the Prior Art

In general, the greater part of original information source such as sound or image being in existence in the circumstances is analog signal. A system for processing the analog signal in a digital manner is called as a digital signal processing system (DSP system).

Recently, as technology for making a digital circuitry into an LSI rapidly progresses, it becomes easy to implement the DSP system on a single chip of a semiconductor device. Furthermore, such a DSP system has many advantages as that it is possible to process with accuracy higher than that of processing in an analog manner, that a desired characteristic can be equally and stably obtained by setting suitable parameters therein, and that it is possible to make a circuit into adjustment-free circuit, and therefore, the DSP system becomes to be rapidly put to practical use. In addition, application domain of the DSP system is extended, and the DSP system is widely utilized in a system for processing signals such as a sound signal, communication signal, measurement signal, image signal, earthquake wave signal, underwater sound signal, and etc.

Furthermore, in a field of audio equipments such as a CD (compact disk) player and a DAT (digital audio tape) player, as digital processing of an audio signal progresses, the DSP system which processes the audio signal in a digital manner is put into practice.

in such a DSP system, since the signal to be processed is digital data, it is necessary to be provided with a data input/output circuit for making data transfer of the digital data from or to an A-D converting circuit which converts the analog signal to digital data or a circuit which fetches the digital data from recording media, or a D-A converting circuit which converts the processed digital data to the analog signal.

In general, for transferring the digital data between the DSP system and the other circuit, a serial data transferring technique is used due to a limit of the number of connecting wires or leads. More specifically, in a conventional data input/output circuit, a shift register having the same bit number as the data to be processed is used, and the data being sent from an external is sequentially stored in the shift register in accordance with synchronous clock signals and the stored data is outputted onto a data bus in a bit-parallel fashion, or the data being sent onto the data bus is inputted to the shift register in a bit-parallel fashion in accordance with synchronous clock signals and the stored data is outputted to an external in a bit-serial fashion.

However, in the conventional data input/output circuit, since the shift register is designed so as to fit a format of the data to be processed, the conventional data input/output circuit cannot be applied to the other devices or circuits in which the formats of the data are different from each other. Therefore, it is necessary to newly design the data input/output circuit to fit the different format of the data to be processed.

For example, in an audio system such as a CD system or a DAT system, or other PCM processing system, the data formats as shown in FIG. 2 are used. In FIG. 2, (A) and (B) show the case where the whole data length is 16 bits and the audio signal data is also 16 bits, and a transfer order of FIG. 2 (A) is "MSB first" and a transfer order of FIG. 2 (B) is "LSB first". Meanwhile, the term "MSB first" means a mode where the most significant bit (MSB) is to be inputted or outputted first, and the term "LSB first" means a mode where the least significant bit (LSB) is to be inputted or outputted first. FIG. 2 (C) and (D) show the case where the whole data length is 24 bits and the audio signal data is 16 bits and other information bits such as control data is included in addition to the audio signal data, and FIG. 2 (C) shows the case of MSB first and FIG. 2 (D) shows the case of LSB first. FIG. 2 (E) and (F) show the case where the whole data length and the audio signal data are respectively 24 bits, and FIG. 2 (E) shows the case of MSB first and FIG. 2 (F) shows the case of LSB first. FIG. 2 (G) and (H) show the case where the whole data length is 32 bits and the audio signal data is 24 bits, and FIG. 2 (G) shows the case of MSB first and FIG. 2 (H) shows the case of LSB first.

In the conventional data input/output circuit, it is impossible to apply the DSP system to the systems in which the data formats are different from each other as described above.

SUMMARY OF THE INVENTION

Therefore, a principal object of the present invention is to provide a novel data input/output circuit.

The other object of the present invention is to provide a data input/output circuit capable of being applied to devices or circuits in which data formats are different from each other.

A data input/output circuit in accordance with the present invention comprises an N-bit shift register into which data can be preset; input gate means for selectively applying data being inputted from an external in a bit-serial fashion to an input of an arbitrary stage of the shift register; output gate means for selecting output of an arbitrary stage of the shift register to output the same in a bit-serial fashion; and control means which generates a control signal in accordance with a format of data to be processed so as to control the input gate means and the output gate means, whereby data having different data format can be sent or received in a bit-serial fashion.

A data input/output circuit of one embodiment further comprises input latch means connected to outputs of arbitrary M bits of the shift register for holding data being stored in the shift register to send the same to a data bus; and output latch means connected to preset terminals of arbitrary M bits of the shift register to preset data being received from the data bus into the shift register, whereby data having different data format can be sent or received in a bit-parallel fashion.

In another embodiment, the N-bit shift register is formed as an N-bit reversible shift register such that the data can be inputted or outputted in a manner of MSB first or LSB first.

In accordance with the embodiment, by changing a shifting direction of the N-bit reversible shift register in accordance with a direction of serial transfer of the data to be processed, that is, MSB first or LSB first, and by selecting input position of the N-bit reversible shift register by changing the input gate means in accordance with the whole data length and effective data length of the data such as audio signal data, the effective data can be fetched into predetermined M bits whereto the input latch means and the output latch means are connected. In addition, in outputting in a bit-serial fashion the effective data which has been preset into the predetermined M bits, by selecting output position of the N-bit reversible shift register by changing a direction of data transfer and output gate means, the effective data can be outputted from the N-bit reversible shift register. Therefore, in accordance with the present invention, it is easy to apply the DSP system, for example, to devices or circuits in which data formats are different from each other, and therefore, in the case where such a data input/output circuit is employed as an input/output circuit of the DSP system for processing the audio signal, it is not necessary to newly design such a DSP system for each data format of the audio signal data, and thus the DSP system becomes to have wide applicability.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 2 is an illustrative view showing formats in respective manners of serial data transfer.

DETAIL DESCRIPTION OF THE PREFERRED EMBODIMENT

Figure 1:
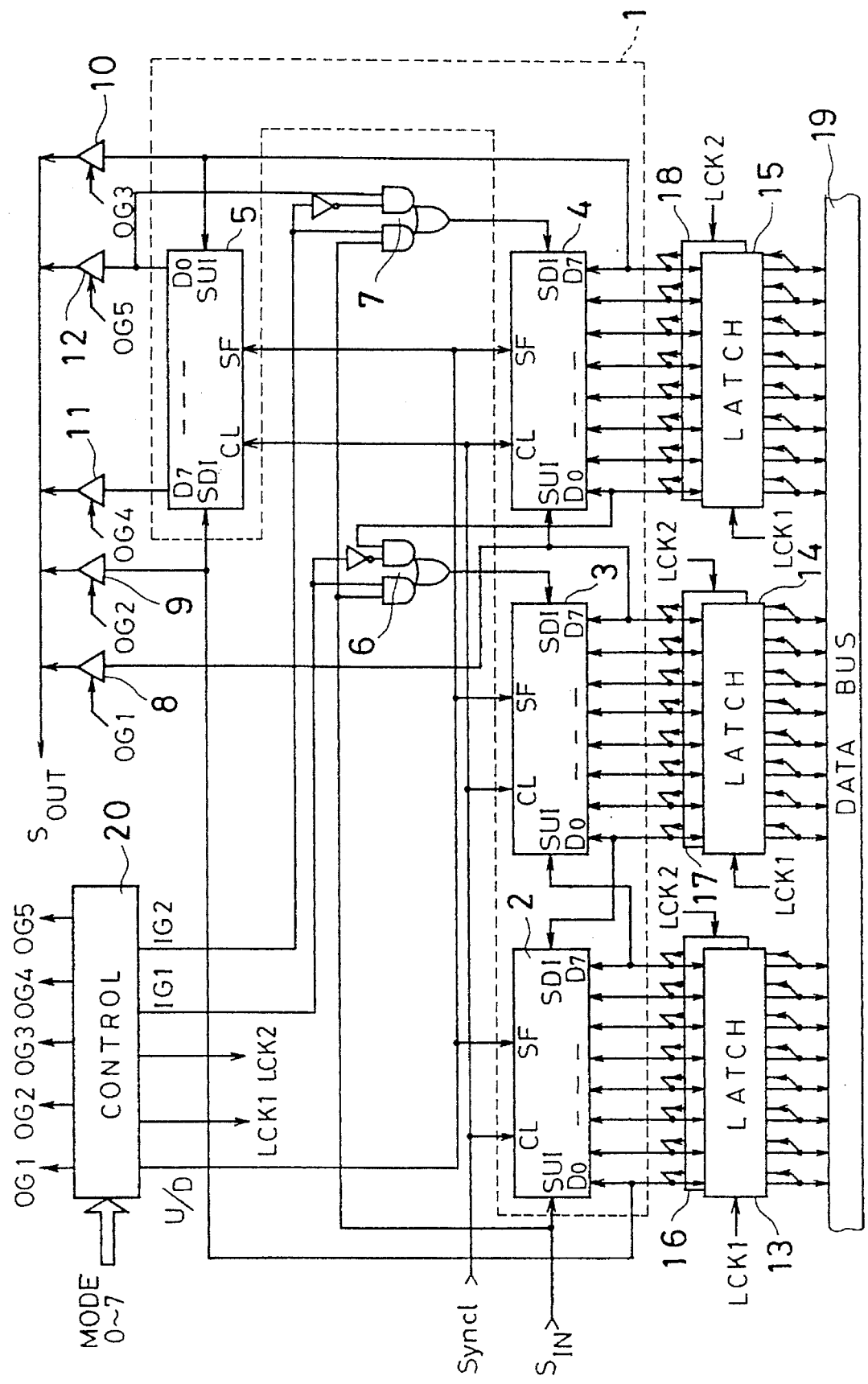
FIG. 1 is a block diagram showing one embodiment in accordance with the present invention.

FIG. 1 is a block diagram showing one embodiment in accordance with the present invention, which is an example of a data input/output circuit which is included in a DSP system and capable of being applied to 8 kinds of data transfer formats as shown in FIG. 2.

In FIG. 1, the numeral 1 denotes a reversible shift register which is constructed by four 8-bit reversible shift registers 2, 3, 4 and 5, and thus the whole bit number of which is 32 bits. Each of the reversible shift registers 2, 3, 4 and 5 is a well-known register into which data can be preset in a bit-parallel fashion, which has a data input SUI used in the case where the data is to be shifted upward, a data input SDI used in the case where the data is to be shifted downward, a control input SF to which a control signal U/D for changing and controlling a shift direction is applied, a clock input CL to which a synchronous signal Syncl of the data is applied, and inputs/outputs $D_0$–$D_7$ which are used both as a parallel output and a preset input of respective stages.

A serial data $S_{IN}$ being applied from an external applied to the input SUI of the reversible shift register 2 and input gate circuits 6 and 7. The input gate circuits 6 and 7 are provided between the reversible shift registers 3 and 4 and between the reversible shift registers 4 and 5, respectively. The input/output $D_0$ of the first stage of the reversible shift register 4 is connected to the input gate circuit 6 an output of which is applied to the input SDI of the reversible shift register 3. The input/output $D_0$ of the first stage of the reversible shift register 5 is connected to the input gate circuit 7 an output of which is applied to the input SDI of the reversible shift register 4. Furthermore, outputs $D_7$ of the last stages of the reversible shift registers 2, 3 and 4 are applied to the inputs SUI of the succeeding reversible shift registers 3, 4 and 5, respectively, and the input/output $D_0$ of the first stage of the reversible shift register 2 is connected to the input SDI of the reversible shift register 5, and the input/output $D_0$ of the first stage of the reversible shift register 3 is applied to the input SDI of the reversible shift register 2. This means that the reversible shift register 1 is constructed as a cyclic register.

In addition, the input/output $D_7$ of the reversible shift register 3, the input/output $D_0$ of the reversible shift register 2, the input/output $D_7$ of the reversible shift register 4 and the inputs/outputs $D_0$ and $D_7$ of the reversible shift register 5 are respectively connected to output gate circuits 8, 9, 10, 11 and 12, whereby the data stored in any stage is selected by the output gate circuits 8, 9, 10, 11 and 12 so as to be outputted as serial data $S_{OUT}$.

Furthermore, input latches 13, 14 and 15 and output latches 16, 17 and 18 are provided between the inputs/outputs $D_0$–$D_7$ of the reversible shift registers 2, 3 and 4 and a data bus 19. The input latches 13, 14 and 15 hold the data being stored in the reversible shift registers 2, 3 and 4 as a unit of 24 bits and transfer the same to the data bus 19 of 24 bits. The output latches 16, 17 and 18 hold the data being sent onto the data bus 19 and preset the same into the reversible shift registers 2, 3 and 4.

On the other hand, based upon signals MODE0–MODE7 designating the data formats as shown in FIG. 2, respectively, a control circuit 20 which is composed of a logical decoder which generates a plurality of control signals for controlling the input gate circuits 6 and 7, the output gate circuits 8, 9, 10, 11 and 12, a shift direction and shift operation of the reversible shift register 1, and latching operations of the input latches 13, 14 and 15 and the output latches 16, 17 and 18. The signals MODE0–MODE7 are given by a microcomputer (not shown) connected to the control circuit 20.

Next, a description will be made on how to operate the data input/output circuit as shown in FIG. 1 in accordance with respective one of the data formats as shown in FIG. 2.

In the case of the data format as shown in FIG. 2 (A), based upon that the signal MODE0 is "1", the control circuit 20 outputs the control signal U/D as "0" to control the shift direction of the reversible shift register 1 as an upward shift direction and outputs the control signal OG1 as "1" to turn on only the output gate circuit 8. Thereby the data of 16 bits being sent to the input SUI of the reversible shift register 2 in a manner of MSB first is sequentially shifted to the reversible shift registers 2 and 3 in synchronism with the synchronous signal Syncl. Therefore, at the time when the 16th synchronous signal Syncl was terminated, the audio signal data of 16 bits is stored or fetched into the reversible shift registers 2 and 3. The data thus stored is held by the input latches 13 and 14 in accordance with a latch pulse LCK1 outputted from the control circuit 20, and sent onto the data bus 19. On the other hand, in outputting the data, the data being sent onto the data bus 19 is held by the output latches 16 and 17 in accordance with a latch pulse LCK2 and the data thus held is preset into the reversible shift registers 2 and 3. Then, by applying 16 synchronous signals Syncl which are generated internally, the data thus preset is sequentially outputted through the output gate circuit 8 as serial data $S_{OUT}$ in a manner of MSB first.

In the case of the data format as shown in FIG. 2 (B), based upon that the signal MODE1 is "1", the control circuit 20 outputs the control signal IG1 as "1" such that the input gate circuit 6 can output the serial data $S_{IN}$, and outputs the control signal OG2 as "1" so as to turn on only the output gate circuit 9, and outputs the control signal U/D as "1" to control the shift direction of the reversible shift register 1 as a downward shift direction. Therefore, the serial data $S_{IN}$ being sent in a manner of LSB first is applied to the input SDI of the reversible shift register 3 through the input gate circuit 6, and sequentially shifted to the reversible shift registers 2 and 3 therefrom in synchronism with the synchronous signal Syncl, and thus the audio signal data of 16 bits is stored or fetched into the reversible shift registers 2 and 3. In outputting the data, the data being preset into the reversible shift registers 2 and 3 is outputted through the output gate circuit 9 as serial data $S_{OUT}$ in a manner of LSB first.

In the case of the data format as shown in FIG. 2 (C), based upon that the signal MODE2 is "1", the control circuit 20 outputs the control signal OG3 as "1" so as to turn on only the output gate circuit 10, and outputs the control signal U/D as "0" to control the shift direction of the reversible shift register 1 as an upward shift direction. Thereby, the serial data $S_{IN}$ being sent to the input SUI of the reversible shift register 2 is sequentially shifted to the reversible shift registers 2, 3 and 4. Therefore, the audio signal data of 16 bits is stored or fetched into the reversible shift registers 2 and 3. In outputting the data, after the dummy data of 8 bits stored in the reversible shift register 4 is outputted, the data being preset into the reversible shift registers 2 and 3 is succeedingly outputted through the output gate circuit 9 in a manner of MSB first.

In the case of the data format as shown in FIG. 2 (D), based upon that the signal MODE3 is "1", the control circuit 20 outputs the control signal U/D as "1" to control the shift direction of the reversible shift register 1 as a downward shift direction, and outputs the control signal IG1 as "0" such that the input gate circuit 6 can make connection between the input/output $D_0$ of the reversible shift register 4 and the input SUI of the reversible shift register 3, and outputs the control signal IG2 as "1" such that the input gate circuit 7 can output the serial data $S_{IN}$, and outputs the control signal OG2 as "1" so as to turn on only the output gate circuit 9. Thereby, the serial data $S_{IN}$ of 24 bits being sent in a bit-serial fashion is applied to the input SDI of the reversible shift register 4 through the input gate circuit 7, and sequentially shifted to the reversible shift registers 3 and 2 through the input gate circuit 6. Therefore, the audio signal data of 16 bits is stored or fetched into the reversible shift registers 2 and 3. In outputting the data, the data being preset into the reversible shift registers 2 and 3 is outputted through the output gate circuit 9 in a bit-serial fashion in a manner of LSB first, and succeedingly thereto, the dummy data of 8 bits stored in the reversible shift register 4 is outputted.

In the case of the data format as shown in FIG. 2 (E), based upon that the signal MODE4 is "1" the same or similar operation is made as the case of FIG. 2 (C); however, the data to be fetched into the reversible shift register 4 and the data to be preset thereinto are respectively a part of the audio signal data. In addition, in the case of the data format as shown in FIG. 2 (F), based upon that the signal MODE5 is "1", the same or similar operation is made as the case of FIG. 2 (D).

In the case of the data format as shown in FIG. 2 (G), based upon that the signal MODE6 is "1", the control circuit 20 outputs the control signal U/D as "0" to control the shift direction of the reversible shift register 1 as an upward shift direction, and outputs the control signal OG4 as "1" so as to turn on only the output gate circuit 11. Thereby, the serial data $S_{IN}$ of 32 bits being sent to the input SUI of the reversible shift register 2 is sequentially shifted to the reversible shift registers 2, 3, 4 and 5. Therefore, the audio signal data of 24 bits is stored or fetched into the reversible shift registers 2, 3 and 4. In outputting the data, after the dummy data of 8 bits stored in the reversible shift register 5 is outputted through the output gate circuit 11, the data being preset into the reversible shift registers 2, 3 and 4 is succeedingly outputted through the reversible shift register 5 and the output gate circuit 11 in a bit-serial fashion.

In the case of the data format as shown in FIG. 2 (H), based upon that the signal MODE7 is "1", the control circuit 20 outputs the control signal U/D as "1" to control the shift direction of the reversible shift register 1 as a downward shift direction, and outputs the control signal IG1 as "0" such that the input gate circuit 6 can make connection between the input/output $D_0$ of the reversible shift register 4 and the input SDI of the reversible shift register 3, and outputs the control signal IG2 as "1" such that the input gate circuit 7 can output the serial data $S_{IN}$, and outputs the control signal OG5 as "1" so as to turn on only the output gate circuit 12. Thereby, the serial data $S_{IN}$ of 32 bits being sent in a bit-serial fashion is supplied to the input SDI of the reversible shift register 4 through the input gate circuit 7, and sequentially shifted to the reversible shift registers 4, 3, 2 and 5. Therefore, the audio signal data of 24 bits is stored or fetched into the reversible shift registers 2, 3 and 4. In outputting the data, after the dummy data of 8 bits stored in the reversible shift register 5 is outputted through the output gate circuit 12, the audio signal data of 24 bits being preset into the reversible shift registers 2, 3 and 4 is succeedingly outputted through the reversible shift register 5 and the output gate circuit 12 in a bit-serial fashion.

Thus, by selecting the input position to which the data is to be applied and the output position from which the data being stored is to be fetched out, and the shift direction of the 32-bit reversible shift register 1, the audio signal data can be fetched into the portion of 24 bits of the reversible shift register 1 whereto the input latches 13, 14 and 15 and the output latches 16, 17 and 18 are connected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data input/output circuit, comprising:

an N-bit shift register into which data can be preset;

serial input gate means for selectively applying data in a bit-serial fashion to an input of an arbitrary stage of the shift register;

serial output gate means for selectively outputting data of an arbitrary state of the shift register in a bit-serial fashion; and control means coupled to said serial input gate means and said serial output gate means for generating a control signal in accordance with a predetermined one of a plurality of serial data formats and to control the serial input gate means and the serial output gate means on the basis of the predetermined serial data format.

2. A data input/output circuit in accordance with claim 1, wherein said N-bit shift register includes a plurality (n) of K-bit (N=nK) shift registers which are connected to each other so as to form said N-bit shift register as a cyclic shift register.

3. A data input/output circuit in accordance with claim 1, wherein said N-bit shift register includes M (M≦N) parallel terminals for outputting data in parallel fashion, further comprising:

input latch means connected to said M-bit parallel terminals of the shift register for holding data being stored in the shift register to preset data being received from the data bus into the shift register in a bit-parallel fashion.

4. A data input/output circuit comprising:

an N-bit reversible shift register having N stages each with a serial input and a serial output;

serial input gate means for selectively applying inputted data in a bit-serial fashion to an input of an arbitrary stage of the reversible shift register;

serial output gate means for selectively output data of an arbitrary stage of the reversible shift register in a bit-serial fashion; and control means coupled to said serial input gate means and said serial output gate means for generating a control signal in accordance with a predetermined one of a plurality of serial data formats and to control the input gate means and the output gate means on the basis of the predetermined serial data format.

5. A data input/output circuit in accordance with claim 4, wherein said N-bit reversible shift register includes a plurality (n) of K-bit (N=nK) reversible shift registers which are connected to each other so as to form said N-bit reversible shift register as a cyclic reversible shift register.

6. A data input/output circuit in accordance with claim 5, wherein each of said plurality of K-bit reversible shift registers includes a first serial input to which data is inputted in a bit-serial fashion when the data is to be shifted upward, a second serial input to which data is inputted in a bit-serial fashion when the data is to be shifted downward, and a plurality of inputs/outputs to or from which data is inputted or outputted.

7. A data input/output circuit in accordance with claim 6, further comprising:

input latch means connected to one of said K-bit (N=nk) reversible shift registers for holding data being stored in the reversible shift register for sending the same to a data bus in a bit-parallel fashion; and output latch means connected t one of said K-bit (N=nk) reversible shift registers to preset data being received from the data bus into the reversible shift register in a bit-parallel fashion.

8. A data input/output interface for a digital signal processing system in accordance with claim 7, the most significant bit and the least significant bit of said K-bit parallel inputs/outputs of said K-bit reversible shift registers are used as serial outputs of said K-bit reversible shift registers.

9. A data input/output circuit in accordance with claim 8, said input gate means includes a pair of gate circuits one of which is connected to said first input of any one said plurality of K-bit reversible shift registers and the other of which is connected to said second input of any one of said plurality of K-bit reversible shift registers.

10. A data input/output circuit in accordance with claim 8, wherein said output gate means includes a plurality of gate circuits connected to one or more of said plurality of inputs/outputs of one or more of said plurality of K-bit reversible shift registers.

* * * * *